US012795948B2

(12) United States Patent
Zhu et al.

(10) Patent No.: US 12,795,948 B2
(45) Date of Patent: Nov. 10, 2026

(54) SELECTOR MATERIAL, SELECTOR UNIT AND PREPARATION METHOD THEREOF, AND MEMORY STRUCTURE

(71) Applicant: SHANGHAI INSTITUTE OF MICROSYSTEM AND INFORMATION TECHNOLOGY, CHINESE ACADEMY OF SCIENCES, Shanghai (CN)

(72) Inventors: Min Zhu, Shanghai (CN); Jiabin Shen, Shanghai (CN); Shujing Jia, Shanghai (CN); Zhitang Song, Shanghai (CN)

(73) Assignee: SHANGHAI INSTITUTE OF MICROSYSTEM AND INFORMATION TECHNOLOGY, CHINESE ACADEMY OF SCIENCES, Shanghai (CN)

( * ) Notice: Subject to any disclaimer, the term of this patent is extended or adjusted under 35 U.S.C. 154(b) by 873 days.

(21) Appl. No.: 17/622,237

(22) PCT Filed: Oct. 29, 2020

(86) PCT No.: PCT/CN2020/124585
§ 371 (c)(1),
(2) Date: May 10, 2023

(87) PCT Pub. No.: WO2021/248781
PCT Pub. Date: Dec. 16, 2021

(65) Prior Publication Data

US 2023/0276638 A1 Aug. 31, 2023

(30) Foreign Application Priority Data

Sep. 16, 2020 (CN) ........................ 202010975902.2

(51) Int. Cl.
*H10B 63/00* (2023.01)
*H10B 61/00* (2023.01)
(Continued)

(52) U.S. Cl.
CPC ............. *H10B 63/24* (2023.02); *H10B 61/10* (2023.02); *H10N 50/85* (2023.02); *H10B 63/10* (2023.02)

(58) Field of Classification Search
CPC ........ H10B 63/24; H10B 61/10; H10B 63/10; H10B 53/20; H10B 53/30; H10N 50/85;
(Continued)

(56) References Cited

U.S. PATENT DOCUMENTS

2016/0336378 A1* 11/2016 Ohba ................ H10N 70/8825
2018/0337329 A1* 11/2018 Gealy .................... H10B 63/80
(Continued)

FOREIGN PATENT DOCUMENTS

CN 1996633 Y 7/2007
CN 105917446 8/2016
(Continued)

*Primary Examiner* — S M Sohel Imtiaz
(74) *Attorney, Agent, or Firm* — IPRTOP LLC

(57) ABSTRACT

The present invention provides a selector material, a selector unit and a preparation method thereof and a memory structure, wherein the selector material comprises at least one of Te, Se and S, that is, the selector material is selected from a simple substance such as Te, Se and S or compounds composed of any of these elements, further, the performance can be improved by doping with elements such as O, N, Ga, In, As and the like, or oxides, nitrides and carbides or other dielectric materials. The selector material in the present invention has the advantages of high turn-on current, simple material, fast switching speed, good repeatability and low toxicity when the selector material is used in the selector
(Continued)

unit, which is beneficial to achieving high-density three-dimensional information storage.

14 Claims, 3 Drawing Sheets

(51) Int. Cl.
*H10N 50/85* (2023.01)
*H10B 63/10* (2023.01)

(58) Field of Classification Search
CPC .. H10N 70/8828; H10N 70/231; H10N 70/24; H10N 70/882; H01L 21/24; H01L 21/28
See application file for complete search history.

(56) References Cited

U.S. PATENT DOCUMENTS

| | | | | |
|---|---|---|---|---|
| 2019/0252609 | A1* | 8/2019 | Sei | G11C 13/0011 |
| 2019/0355789 | A1* | 11/2019 | Donghi | H10B 63/80 |
| 2019/0363134 | A1* | 11/2019 | Ohba | H10B 61/10 |
| 2020/0075675 | A1* | 3/2020 | Wu | H10N 70/8828 |
| 2020/0091244 | A1* | 3/2020 | Chan | H10B 63/24 |
| 2020/0302985 | A1* | 9/2020 | Aikawa | G11C 11/1657 |
| 2020/0411524 | A1* | 12/2020 | Arslan | H10B 12/0335 |

FOREIGN PATENT DOCUMENTS

| | | | | | |
|---|---|---|---|---|---|
| CN | 105917446 | A | * | 8/2016 | H10W 20/0633 |
| CN | 105917446 | Y | | 8/2016 | |
| CN | 106601907 | | | 4/2017 | |
| CN | 109949836 | A | * | 6/2019 | G11C 13/003 |
| CN | 109949836 | Y | | 6/2019 | |
| CN | 111129070 | | | 5/2020 | |
| CN | 111129070 | A | * | 5/2020 | H10B 63/22 |
| CN | 111129070 | Y | | 5/2020 | |
| CN | 111463346 | A | | 7/2020 | |

* cited by examiner

SELECTOR MATERIAL, SELECTOR UNIT AND PREPARATION METHOD THEREOF, AND MEMORY STRUCTURE

CROSS REFERENCE TO RELATED APPLICATION

The present application claims the benefit of priority to Chinese Patent Application No. CN 202010975902.2, entitled "SELECTOR MATERIAL, SELECTOR UNIT AND PREPARATION METHOD THEREOF, AND MEMORY STRUCTURE", filed with CNIPA on Nov. 16, 2020, the disclosure of which is incorporated herein by reference in its entirety.

FIELD OF TECHNOLOGY

The present invention relates to the technical field of micro/nano electronics, in particular to a selector material, a selector unit and a preparation method thereof, and a memory structure.

BACKGROUND

With the gradual popularization of 5G and the booming development of emerging technologies such as VR, unmanned driving and the like, higher requirements have been put forward for data storage speed and capacity. To this end, novel non-volatile storage materials have come into view, such as phase change storage materials. At present, the existing data storage technology has reached size limit at sub-nanometer. To achieve a more massive unit storage capacity, cross-type stacked arrays must be adopted to break through the capacity limit of dimensional storage.

A selector device with good switching performance is in need to select a memory cell. The selector is a switch that controls a selector device through electrical signals. When an electrical signal is applied to a selector device unit, the material changes from a high-resistance state to a low-resistance state and the device is in an on state; when the electrical signal is withdrawn, the material changes from the low-resistance state to the high-resistance state and the device is in an off state. The existing selectors include ovonic threshold switching (OTS), conductive bridge threshold switching (CBTS) and metal-insulator transition switching (MITS).

However, the existing selectors (such as OTS), with complex material compositions, have developed from being binary to being pentabasic or even hexahydric. In addition, these complex OTS materials all contain toxic substances such as As, which is not conducive to the requirement of sustainable development. Meanwhile, the switching speed of these selector devices is in microseconds and above, which also limits their application in novel phase change storage devices. Besides, there are also problems like small turn-on current $I_{on}$, large leakage current $I_{off}$, small selection ratio ($I_{on}/I_{off}$), and poor fatigue performance.

Therefore, how to provide a selector material, a selector unit and a memory structure to solve the above problems is really necessary.

SUMMARY

The present invention aims to provide a selector material, a selector unit and a memory structure for achieving simple components, low material toxicity, high turn-on current, small leakage current, high selection ratio and good fatigue performance.

The present invention provides a selector material, and the selector material includes at least one of Te, Se and S.

Optionally, the chemical formula of the selector material is $(Te_xSe_yS_z)_{1-t}M_t$, where M includes doping materials, and $0 \leqslant x \leqslant 100$, $0 \leqslant y \leqslant 100$, $0 \leqslant z \leqslant 100$, $0 \leqslant t \leqslant 0.5$.

Optionally, the doping materials include at least one of O, N, Ga, In and As.

Optionally, the doping materials include at least one of an oxide, a nitride and a carbide.

Optionally, the oxide includes at least one of SiOx, TiOx, TaOx, HfOx, TiOx, GeOx, SnOx, AlOx and GaOx; and/or, the nitride includes at least one of SiNx, GeNx, AlNx and SnNx; and/or, the carbide includes at least one of SiCx, GeCx and AlCx.

Optionally, the selector material with nonlinear conductivity characteristics is used in a neural network as a neural component.

Optionally, the selector material has ovonic threshold switching type selecting characteristics.

Optionally, the selector material may achieve a transient transition from a high-resistance state to a low-resistance state when a voltage is applied to a preset value, and return to the high-resistance state instantly and spontaneously when an electrical signal is withdrawn.

Optionally, a transient transition time from the high-resistance state to the low-resistance state of the selector material is between 100 μs and 1 μs, and a transient transition time from the low-resistance state to the high-resistance state is between 500 μs and 5 μs.

Optionally, when the selector material is in the high-resistance state, the selector material includes an amorphous state or a crystalline state; and when the selector material is in the low-resistance state, the selector material includes an amorphous state, a crystalline state or a molten state.

In addition, the present invention further provides a selector unit, and the selector unit includes:

- a selector material layer, including any of the selector material described above;
- a first electrode, arranged on the upper surface of the selector material layer;
- a second electrode, arranged on the lower surface of the selector material layer;

or, the selector unit includes:

- the selector material layer, including any of the selector material stated above;
- the first electrode and the second electrode are simultaneously arranged on the upper surface or the lower surface of the selector material layer, to form a horizontal structure.

Optionally, a shape of the second electrode includes a T shape, a μ shape, and partially or fully-defined shapes.

Optionally, a thickness of the selector material layer is between 2 nm and 100 nm.

Optionally, a turn-on current of the selector unit is greater than or equal to $10^{-4}$ A, a leakage current of the selector unit is less than or equal to $10^{-5}$ A, and a cycle number of the selector unit is greater than or equal to $10^3$.

As an example, an on/off current ratio of the selector unit is between 1-8 orders of magnitude.

The present invention further provides a preparation method of a selector unit, including the following steps: providing a substrate, and preparing the first electrode, the second electrode, and the selector material layer on the substrate, wherein the selector material layer is prepared based on a magnetron sputtering process.

In addition, the present invention further provides a memory structure, wherein the memory structure includes:

any of the selector unit described above;

a storage material layer, arranged on the lower surface of the second electrode; and a third electrode, arranged on the lower surface of the storage material layer.

Optionally, the storage material layer includes any one of a phase change storage material layer, a resistive storage material layer, a magnetic storage material layer, and a ferroelectric storage material layer.

Optionally, the memory structure includes a plurality of the first electrodes arranged in parallel at intervals and a plurality of the third electrodes arranged in parallel at intervals, where the plurality of the first electrodes extend along a first direction, and the plurality of the third electrodes extend along a second direction. An angle is formed between the first direction and the second direction, and the angle is greater than 0° and less than or equal to 90°. The selector material layer, the second electrode, and the storage material layer together constitute a selection storage unit, and the memory structure includes a plurality of the selection storage units. The selection storage units are arranged in the overlapping area of the first electrodes and the third electrodes.

Optionally, the selector material layer, the second electrode and the storage material layer all include at least N layers, which are stacked in a vertical direction to form an N-layered structure, and a storage density of the obtained memory structure is 4 $F^2/N$. To achieve mass storage, where F is the feature size of the semiconductor process, and N is an integer greater than or equal to 2.

As mentioned above, the selector material is selected from a simple substance such as Te, Se and S or compounds composed of any of these elements, and the performance can be improved by doping with elements, such as O, N, Ga, In, As and the like, or oxides, nitrides and carbides or other dielectric materials. The performance including the threshold voltage, the turn-on current and the fatigue characteristics of the selector unit made of the selector material can be adjusted and optimized, resulting in improving the thermal stability of the selector unit made of the selector material, reducing the leakage current of the selector unit made of the selector material, and enhancing the repeatability of the selector unit made of the selector material. The selector material when used in the selector unit has the advantages of high turn-on current, simple material, fast switching speed, good repeatability and low toxicity, which is beneficial to achieving high-density three-dimensional information storage.

REFERENCE NUMERALS

Figure 1:
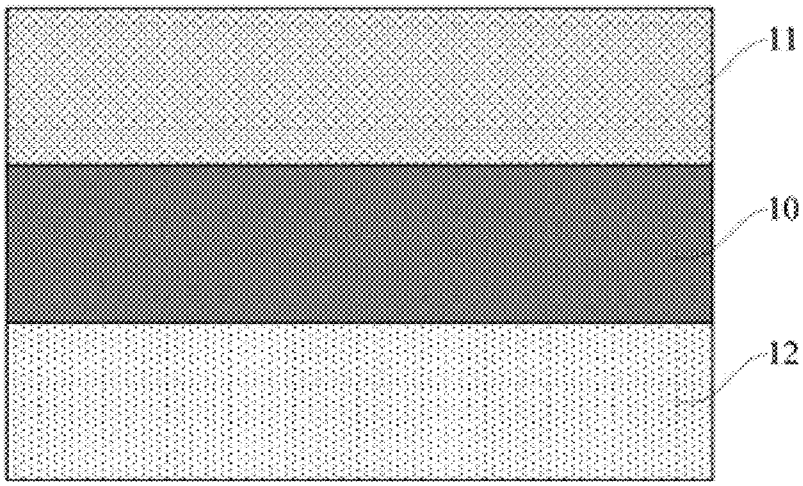
FIG. 1 shows a sectional view of an example of a selector unit provided in the embodiment of the present invention.

10 selector material layer
11 first electrode
12 second electrode
13 storage material layer
14 third electrode

DETAILED DESCRIPTION

The implementations of the present invention will be described below through specific examples, and those skilled in the art can easily understand other advantages and effects of the present invention from the contents disclosed in the present specification. The present invention may also be implemented or applied by other different specific implementations, and the details in the present specification may be modified or changed in various ways based on different views and applications without departing from the spirit of the present invention.

As in the detailed description of the embodiment of the present invention, the sectional drawings indicating the structure of the device will not be partially enlarged according to the general scale for ease of illustration. The schematic drawings are merely examples, which should not limit the protection scope of the present invention. In addition, during actual production, the three-dimensional space dimensions of length, width and depth should be included.

To facilitate description, spatial relation terms such as "under", "below", "beneath", "underneath", "above", "on" and the like may be used herein to describe the relationship between one element or feature shown in the accompanying drawings and other elements or features. It should be understood that these spatial relationship terms are intended to encompass directions of the device in use or in operation other than those directions depicted in the accompanying drawings. In addition, when a layer is referred to as being "between" two layers, it may be the only layer between the two layers, or there may be one or more layers between the two layers. In addition, "between . . . and . . . " as used in the present invention includes two endpoint values.

In the context of the present application, the described structure with the first feature "above" the second feature may include embodiments in which the first feature and second feature are in direct contact, or may include embodiments in which additional features formed between the first feature and second feature, such that the first and second features may not be in direct contact.

It should be noted that the drawings provided in the present embodiment illustrate the basic idea of the present invention only schematically, so that the drawings only show the components related to the present invention rather than being drawn according to the number, shape and size of the components during actual implementation. And the pattern, number and proportion of the components in actual implementation may be changed arbitrarily, and the layout of the components may also be more complex.

The present invention provides a selector material, and the selector material includes at least one of Te, Se and S. The selector material is composed of at least one of Te (tellurium), Se (selenium), and S (sulfur), i.e., the selector material can be a simple substance such as Te, Se, and S, or a mixture of any two elements among them, or a mixture of three elements. The material has the advantages of high turn-on current, low leakage current, good thermal stability, simple material, non-toxicity and fast switching speed when the material is used in the selector unit.

In an example, the chemical formula of the selector material is $Te_aSe_bS_c$, where $0\leq a\leq 1$, $0\leq b\leq 1$, $0\leq c\leq 1$, a+b+c=1, and a, b, c are atomic percentages of elements. In a preferred example, pure Te for example has the advantages of simple materials, high turn-on current, long device life, good performance all the time and the ability to operate properly in high temperature environments from room temperature to 400° C. In a preferred example, adding Se to Te will further increase the forbidden band width, reduce the device leakage conductance, and improve the switching ratio of the device. Meanwhile, since the melting point of Se is only about 250° C., the energy required for melting is reduced, thereby reducing the power consumption for operation. For example, the specific design can be Te80Se20, Te50Se50, and Te20Se80.

In an example, the chemical formula of the selector material is $(Te_xSe_yS_z)_{1-t}M_t$, where M includes doping materials and $0\leq x\leq 100$, $0\leq y\leq 100$, $0\leq z\leq 100$, $0<t\leq 0.5$. t is the atomic percentage of the doping materials in the selector material, for example, t can be 0.05, 0.1, 0.15, 0.2, 0.25, 0.3, 0.4, etc.

In an example, the doping materials include at least one of O, N, Ga, In, As, i.e., the doping materials may be any one of O, N, Ga, In, As, or a combination of at least two of the above elements. A doping content does not exceed 50 at. %, e.g., the doping content may be 20 at. %, 30 at. %, 40 at. %, etc. After doping, the device performance of the material will be improved, including improved thermal stability, increased on-state current, reduced leakage current, increased switching ratio, and extended device life, etc. In the example, the doping of the above elements in the selector material can adjust and optimize such performances as threshold voltage, turn-on current and fatigue characteristics of the selector unit made of the selector material, such that the selector material has increased turn-on current, increased selection ratio and better cycling performance.

As an example, the doping materials include at least one of an oxide, a nitride and a carbide. The doping materials may be any one of oxide, nitride and carbide, or a combination of any two or three of the above substances. After doping, the material has the efficacy of improved thermal stability, increased on-state current, reduced leakage current, increased switching ratio, extended device life, etc.

As an example, the oxide includes at least one of SiOx, TiOx, TaOx, HfOx, TiOx, GeOx, SnOx, AlOx and GaOx.

As an example, the nitride includes at least one of SiNx, GeNx, AlNx and SnNx.

As an example, the carbide includes at least one of SiCx, GeCx and AlCx.

Wherein, and/or indicates that three doping materials can be selected as described above simultaneously, or any one of them can be selected as described above, or any two of them can be selected as described above. For example, the design of the present invention can be Te80(SiO2)20, Te50(SiO2)50, Se80(SiN)20, Se50(SiN)50, S80(SiC)20, S50(SiC)50.

As an example, the selector material obtained in the present invention can achieve a transient transition from a high-resistance state (off state) to a low-resistance state (on state) when a voltage is applied to a preset value (threshold voltage) and can return to the high-resistance state (off state) instantly and spontaneously when the electrical signal is withdrawn.

In further examples, a transient transition time from the high-resistance state to the low-resistance state of the selector material is between 100 ps and 1 μs, and a transient transition time from the low-resistance state to the high-resistance state is between 500 ps and 5 μs. When element composition of the chemical formula of the selector materials in the present invention is different, the transient transition time is different. The transient transition time from the high-resistance state to the low-resistance state in the present invention can be 100 ps, 1 ns, 10 ns, 1 μs, and the transient transition time from the low-resistance state to the high-resistance state can be 500 ps, 5 ns, 50 ns, 50 μs.

As an example, as to the material design of the present invention, when the selector material is in a high-resistance state, the selector material includes an amorphous state or a crystalline state. The high-resistance state which is in an amorphous state has a fast switching speed using an electronic transport mechanism. The high-resistance state in a crystalline state may avoid crystallization of the materials due to high-temperature post processes, which can lead to the device ineffective. When the selector material is in a low-resistance state, the selector material includes an amorphous state, a crystalline state or a molten state. Different states of the material can be controlled and adjusted through the material growth temperature and thickness.

As an example, the selector material has nonlinear conductivity characteristics and can be used as a neural component or nerve synapse device in neural networks, to achieve functions such as converting external analog signals into pulse signals.

As an example, the selector material has an ovonic threshold switching type selector characteristic. It can be used as an ovonic threshold switch (OTS). The basic principle of the OTS selector device is that an electrical signal is used to control the switching of the selector device, and when the applied electrical signal is higher than the threshold voltage, the material changes from a high-resistance state to a low-resistance state, and at this time, the device is in an on state; when the electrical signal is withdrawn, the material changes from the low-resistance state to the high-resistance state, and the device is in an off state. In the present invention, OTS can be obtained based on the above material design, where the OTS material has ovonic selection characteristics and can satisfy the $MA/cm^2$ on-state current density required for the phase change memory, which is the key to achieving high-density three-dimensional integration of the memory. However, the existing OTS materials are complex in composition, and these complex OTS materials contain toxic substances such as As, which is not conducive to the requirement of sustainable development. Other types of selector devices are not yet to meet the current density of $MA/cm^2$ required to drive phase change memories. Meanwhile, the switching speed of these selector devices is in microseconds and above, which also limits their applications in novel phase change storage devices. The selector material of the present invention can solve the above problems of OTS, with the advantages of high turn-on current, low leakage current, good thermal stability, simple material, no toxicity and fast switching speed.

As an example, the on/off current ratio (that is, the selection ratio) of the selector material may include 1-8 orders of magnitude, for example, 2 orders of magnitude, 3 orders of magnitude or 6 orders of magnitude.

In addition, as shown in FIG. 1, the present invention further includes a selector unit, and the selector unit includes a selector material layer 10, a first electrode 11 and a second electrode 12, wherein:

the selector material layer 10 includes any of the selector material described above, i.e., the selector material layer 10 is prepared from any of the selection material described above; and for the components of the selector material layer 10, please refer to the specific description of the selector material above, which will not be repeated redundantly herein.

The first electrode 11 is arranged on the upper surface of the selector material layer 10; the second electrode 12 is arranged on the lower surface of the selector material layer 10. In addition, the first electrode 11 and the second electrode 12 are both arranged on the upper surface of the selector material layer 10 or on the lower surface of the selector material layer 10, to form a horizontal structure.

As an example, the shape of the second electrode includes a T shape, a μ shape, and partially or fully-defined shapes.

As an example, the selector material layer 10 may be formed by, but not limited to, a magnetron sputtering process. For simple substances such as Te, Se and S, single target sputtering is adopted; for mixtures of at least two elements, an alloy target or simple substance targets can be adopted for co-sputtering; and doping can be achieved through an alloy target or co-sputtering with a compound target.

As an example, the thickness of the selector material layer 10 can be adjusted according to actual needs, preferably, the thickness of the selector material layer 10 can be 2 nm-100 nm, more preferably, in the present embodiment, the thickness of the selector material layer 10 is 5 nm-20 nm, for example, 10 nm or 15 nm is selected.

As an example, the first electrode 11 may be formed on the upper surface of the selector material layer 10 through adopting any one of a sputtering method, an evaporation method, a chemical vapor deposition (CVD) method, a plasma enhanced chemical vapor deposition (PECVD) method, a low pressure chemical vapor deposition (LPCVD) method, a metal compound vapor deposition (MOCVD) method, a molecular beam epitaxy (MBE) method, an atomic vapor deposition (AVD) method or an atomic layer deposition (ALD) method.

As an example, the second electrode 12 may be formed on the lower surface of the selector material layer 10 through adopting any one of a sputtering method, an evaporation method, a chemical vapor deposition (CVD) method, a plasma enhanced chemical vapor deposition (PECVD) method, a low pressure chemical vapor deposition (LPCVD) method, a metal compound vapor deposition (MOCVD) method, a molecular beam epitaxy (MBE) method, an atomic vapor deposition (AVD) method or an atomic layer deposition (ALD) method.

As an example, the material of the first electrode 11 may include, but is not limited to, at least one of Ti (titanium), TiN (titanium nitride), Ag (silver), Au (gold), Cu (copper), Al (aluminum), and W (tungsten). The material of the second electrode 12 may include, but is not limited to, at least one of Ti, TiN, Ag, Au, Cu, Al, and W.

As an example, a transition layer (not shown) may also be arranged between the first electrode 11 and the selector material layer 10, i.e., at this time, the transition layer is arranged on the upper surface of the selector material layer 10, and the first electrode 11 is arranged on the upper surface of the transition layer. The material of the transition layer may include, but is not limited to, TiN (titanium nitride). The transition layer is configured to increase the adhesion force between the first electrode 11 and the selector material layer 10. The thickness of the transition layer may be set according to actual needs, for example, the thickness of the transition layer may be but not limited to 2 nm, 8 nm, 10 nm. Of course, when the transition layer is not arranged between the first electrode 11 and the selector material layer 10, the first electrode 11 may be formed directly on the upper surface of the selector material layer 10.

As an example, a transition layer (not shown) may also be arranged between the second electrode 12 and the selector material layer 10, i.e., at this time, the transition layer is arranged on the lower surface of the selector material layer 10, and the second electrode 12 is arranged on the lower surface of the transition layer. The material of the transition layer may include, but is not limited to, TiN (titanium nitride). The transition layer is configured to increase the adhesion force between the second electrode 12 and the selector material layer 10. The thickness of the transition layer may be set according to actual needs, for example, the thickness of the transition layer may be but not limited to 2 nm, 8 nm, 10 nm. Of course, when the transition layer is not arranged between the second electrode 12 and the selector material layer 10, the second electrode 12 may be formed directly on the lower surface of the selector material layer 10.

As an example, the turn-on current $I_{on}$ of the selector unit is greater than or equal to $10^{-4}$ A, the leakage current $I_{off}$ of the selector unit is less than or equal to $10^{-5}$ A, and the cycle number of the selector unit is greater than or equal to $10^3$ times. Preferably, in the present embodiment, the turn-on current $I_{on}$ of the selector unit is greater than or equal to $10^{-3}$ A, the leakage current $I_{off}$ of the selector unit is less than or equal to $10^{-10}$ A, and the cycle number of the selector unit is greater than or equal to $10^7$ times.

As an example, the on/off current ratio of the selector material is between 1-8 orders of magnitude, for example, it can be 2 orders of magnitude, 3 orders of magnitude, and 6 orders of magnitude, in addition, the selection ratio of the selector unit can be greater than or equal to 6.

Figure 2:
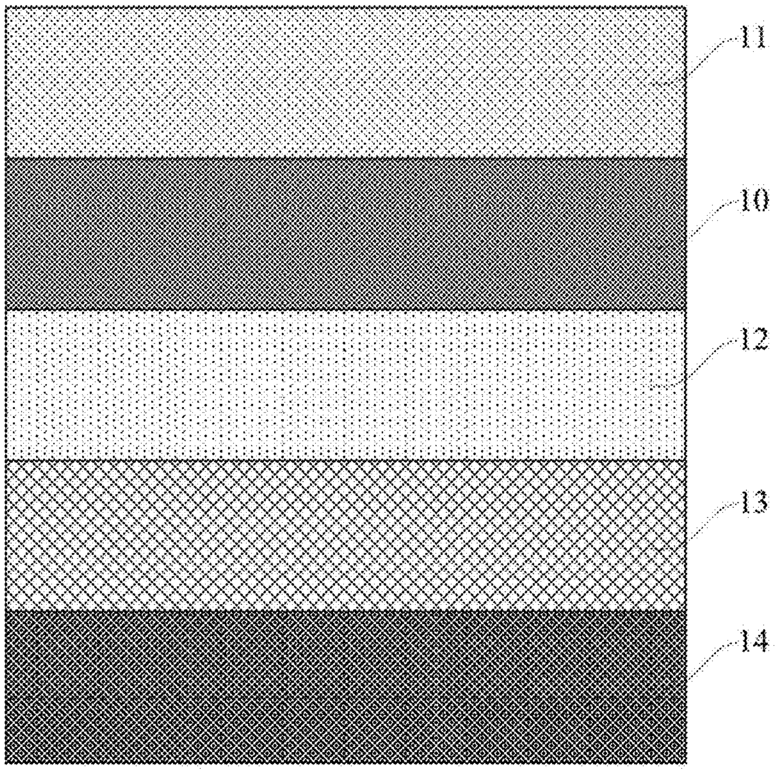
FIG. 2 shows a sectional view of an example of a memory structure provided in the embodiment of the present invention.
Figure 3:
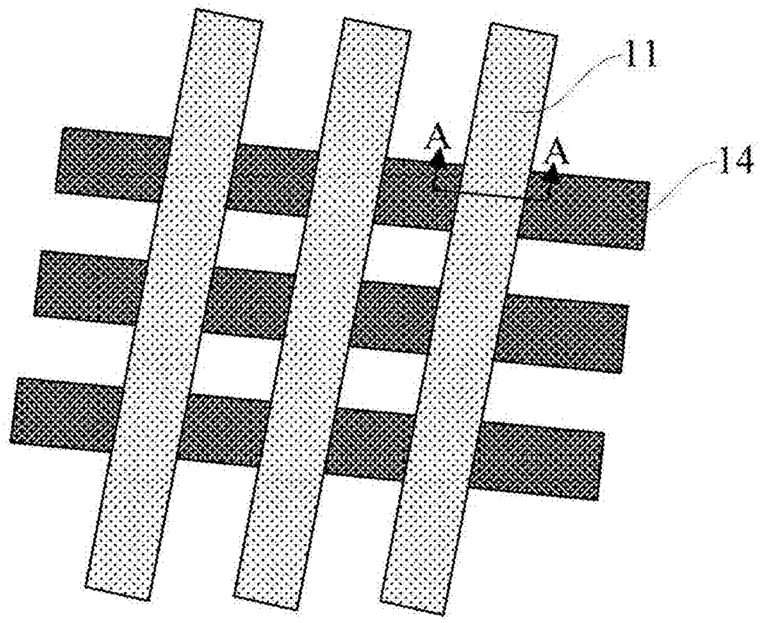
FIG. 3 shows a schematic diagram of a partial top view of a memory structure provided in the embodiment of the present invention.

Further, as shown in FIGS. 2-3, the present invention further provides a memory structure, and the memory structure includes: any of selector unit described in the above example, a storage material layer 13 and a third electrode 14; where the specific structure of the selector unit is not repeated redundantly herein by referring to the description in the above solution; the storage material layer 13 is arranged on the lower surface of the second electrode 12; and the third electrode 14 is arranged on the lower surface of the storage material layer 14. At this time, the first electrode 11 serves as an upper electrode, the second electrode 12 serves as an intermediate electrode, and the third electrode 14 serves as a lower electrode.

As an example, the thickness of the second electrode 12 can be set according to actual needs. Preferably, in the present embodiment, the thickness of the second electrode 12 can include a thickness from 5 nm to 100 nm, for example, the thickness can be 10 nm, 15 nm, 25 nm.

As an example, the storage material layer 13 includes any one of a phase change storage material layer, a resistive storage material layer, a magnetic storage material layer, and a ferroelectric storage material layer.

As an example, the memory structure may include a plurality of the first electrodes 11 arranged in parallel at intervals and a plurality of the third electrodes 14 arranged in parallel at intervals, where the plurality of the first electrodes 11 extend along a first direction and the plurality of the third electrodes 14 extend along a second direction. An angle is formed between the first direction and the second direction, and the angle is greater than 0° and less than or equal to 90°, for example, the angle may be 45°, 60°, etc. The selector material layer 10, the second electrode 12 and the storage material layer 13 together constitute a selection storage unit, and the memory structure includes a plurality of selection storage units. The plurality of selection storage units are arranged between the first electrode 11 and the third electrode 14 and are arranged within the overlapping area of the first electrode 11 and the third electrode 14. It should be noted that the selection storage units being arranged within the overlapping area of the first electrode 11 and the third electrode 14 means that the orthographic projection of the selection storage units in the plane in which the third electrode 14 is located is within the orthographic projection of the first electrode 11 in the plane in which the third electrode 14 is located, and that the orthographic projection of the selection storage units in the plane in which the first electrode 11 is located is within the orthographic projection of the third electrode 14 in the plane in which the first electrode 11 is located.

As an example, the selector material can be integrated in three dimensions with novel memories such as a phase change memory, a ferroelectric memory, a magnetic memory and a resistive memory, which can be used in cross or vertical storage arrays with a density of 4 $F^2$ (F is the feature size of the semiconductor process).

In another example, the selector material layer, the second electrode and the storage material layer all include at least N layers, which are stacked in a vertical direction to form an N-layered structure. The storage density of the obtained memory structure is 4 $F^2/N$, to achieve mass storage, where F is the feature size of the semiconductor process, and N is an integer greater than or equal to 2.

The existing data storage technology has reached the size limit at sub-nanometer, and to achieve a more massive unit storage capacity, cross-type stacked arrays must be adopted to break through the capacity limit of dimensional storage. However, such array structures suffer from leakage crosstalk during reading and writing, therefore, a selector device must be added to the storage unit, for example, a device prepared based on the selector material of the present invention. These selector devices have nonlinear conductivity characteristics and generate a large on-state current ($I_{ON}$) when the applied voltage reaches a threshold value for operation on the storage unit. While when the applied voltage reaches ½ threshold voltage, the selector will be in an off state, thereby limiting the passage of a leakage current ($I_{OFF}$) that is less than the read/write current by more than one order of magnitude in the corresponding storage unit.

To further illustrate beneficial effects of the present invention, the following embodiments are further provided.

Embodiment 1

Figure 4:
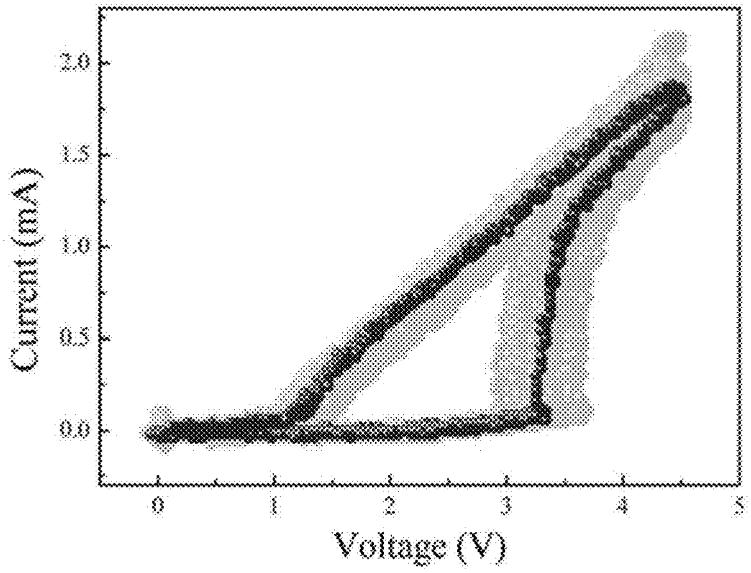
FIG. 4 shows a voltage-current curve of a selector unit in embodiment 1 of the present invention.

In embodiment 1, the selector material layer 10 in the selector unit is a Te layer with a thickness of 20 nm obtained through a magnetron sputtering process (a Te target is directly used for sputtering) (that is, at this time, the selector material layer is a Te simple substance layer). The second electrode 12 is an electrode with a diameter of 200 nm (that is, the device is a columnar electrode with a diameter of 200 nm), and the first electrode 11 is a TiN electrode. In the present embodiment, the voltage-current curve obtained after repeated tests of the selector unit through a probe station is as shown in FIG. 4 (in FIG. 4, twenty voltage-current curves being obtained by repeating the test for twenty times are taken as an example). It can be seen from FIG. 4 that, when the voltage applied on the selector unit is less than 3V, the selector unit is in an off state, and the current passing through the selector unit is very small which is less than $10^{-7}$ A; when the voltage applied on the selector unit exceeds a threshold voltage (3V~3.7V), the selector unit is turned on instantaneously, and the current passing through the selector unit increases sharply to $10^{-3}$ A; when the voltage applied on the selector unit is withdrawn, the selector unit is instantly turned off, the current passing through the selector unit decreases sharply and the selector unit becomes into a high-resistance state. It can be seen from FIG. 4 that the selector unit has been repeatedly tested for multiple times, and the voltage-current curve obtained each time has consistent performance, which indicates that the selector unit has very good repeatability.

Figure 5:
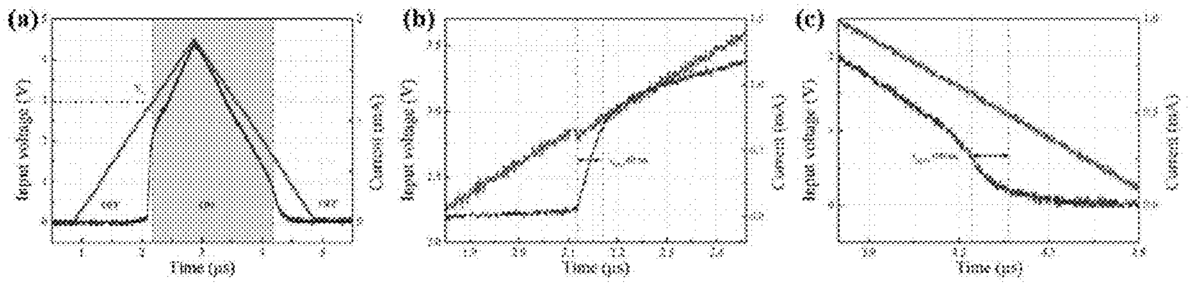
FIG. 5 shows a pulse test curve of the selector unit in embodiment 1 of the present invention.

In addition, in the present example, the curve obtained after testing the pulse response of the selection unit through the probe station is shown in FIG. 5. It can be seen from FIG. 5 that, when the voltage applied on the selector unit is less than 3V, the selector unit is in an off state and the current passing through the selector unit is very small; when the voltage applied on the selector unit increases and exceeds a threshold voltage, the selector unit is turned on instantaneously, the current passing through the selector unit increases sharply and the time required to open the selector is about 40 ns; when the voltage applied on the selector unit decreases to 1.5V, the selector unit is turned off instantaneously, the current passing through the selector unit decreases sharply, the selector unit becomes into a high-resistance state, and the time required to turn off the selector is about 100 ns, indicating that the switching speed of the selector unit is very fast.

Embodiment 2

Figure 6:
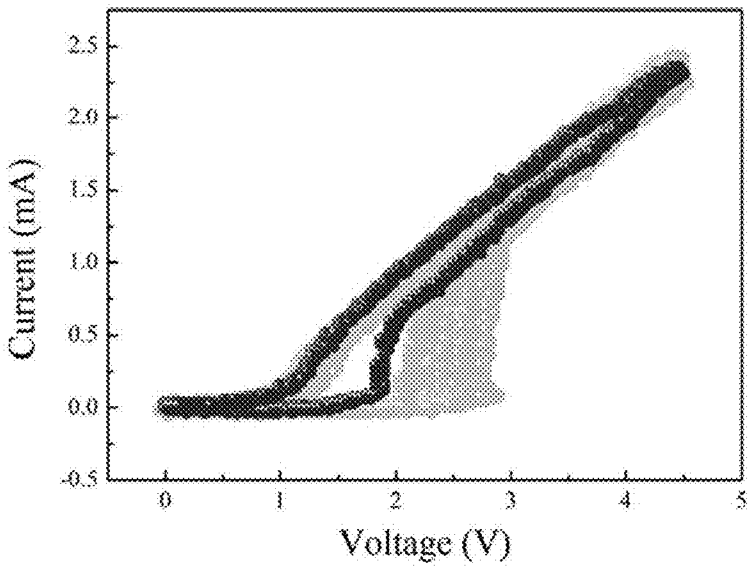
FIG. 6 shows a voltage-current curve of a selector unit in embodiment 2 of the present invention.

In embodiment 2, the selector material layer 10 in the selector unit is a Te layer with a thickness of 20 nm obtained through a magnetron sputtering process (a Te target is directly used for sputtering) (that is, at this time, the selector material layer 10 is a Te simple substance layer). The second electrode 12 is an electrode with a diameter of 150 nm (that is, the device is a columnar electrode with a diameter of 150 nm). The size of the lower electrode is not the same, the magnitude of the current is the same. The smaller the size, the greater the current density. The first electrode 11 is a TiN electrode. The voltage-current curve obtained after repeated tests of the selector unit described in the present example through a probe station is as shown in FIG. 6 (in FIG. 6, four voltage-current curves being obtained by repeating the test for four times are taken as an example). It can be seen from FIG. 6 that, when the voltage applied on the selector unit is less than 2V, the selector unit is in an off state, and the current passing through the selector unit is very small which is less than $10^{-7}$ A; when the voltage applied on the selector unit exceeds a threshold voltage (2V~2.8V), the selector unit is turned on instantaneously, and the current passing through the selector unit increases sharply to $10^{-3}$ A; when the voltage applied on the selector unit is withdrawn, the selector unit is instantly turned off, the current passing through the selector unit decreases sharply and the selector unit becomes into a high-resistance state. Since the size of the device is decreased, while the on-state current is almost unchanged, therefore, the current density will increase sharply as the size of the device decreases. Then the selection material has a greater advantage after the device is miniaturized. It can be seen from FIG. 6 that the selector unit is repeatedly tested for multiple times, and the voltage-current curve obtained each time has consistent performance, which indicates that the selector unit has very good repeatability.

In summary, the selector material is selected from a simple substance such as Te, Se and S or compounds composed of any of these elements, and the performance can be improved by doping with elements, such as O, N, Ga, In, As and the like, or oxides, nitrides and carbides or other dielectric materials. The performance including the threshold voltage, the turn-on current and the fatigue characteristics of the selector unit made of the selector material can be adjusted and optimized, resulting in improving the thermal stability of the selector unit made of the selector material, reducing the leakage current of the selector unit made of the selector material, and enhancing the repeatability of the selector unit made of the selector material. The selector material when used in the selector unit has the advantages of high turn-on current, simple material, fast switching speed, good repeatability and low toxicity, which is beneficial to achieving high-density three-dimensional information storage. Therefore, the present invention effectively overcomes the shortcomings of the prior art and has high industrial value.

The above embodiments are merely illustrative of the principles of the invention and the effects, and are not intended to limit the present invention. Those skilled in the art may modify or change the above embodiments without violating the spirit and scope of the present invention. Therefore, all the equivalent modifications or changes made by those with ordinary knowledge in the art without departing from the spirit and technical ideas revealed by the present invention shall all fall within the claims of the present invention.

What is claimed is:

1. A selector material, wherein a chemical formula of the selector material is $(Te_xSe_yS_z)_{1-t}M_t$, wherein M comprises doping materials, and 0≤x≤100, 0≤y≤100, 0≤z≤100, 0<t≤0.5; wherein the selector material achieves a transient transition from a high-resistance state to a low-resistance state when a voltage is applied to a preset value, and returns to the high-resistance state instantly when an electrical signal is withdrawn; and wherein a transient transition time from the high-resistance state to the low-resistance state of the selector material is between 100 ps and 1 μs, and a transient transition time from the low-resistance state to the high-resistance state is between 500 ps and 5 μs.

2. The selector material according to claim 1, wherein the doping materials comprise at least one of O, N, Ga, In and As.

3. The selector material according to claim 1, wherein the doping materials comprise at least one of an oxide, a nitride and a carbide.

4. The selector material according to claim 3, wherein the oxide comprises at least one of SiOx, TiOx, TaOx, HfOx, TiOx, GeOx, SnOx, AlOx and GaOx; and/or, the nitride comprises at least one of SiNx, GeNx, AlNx and SnNx; and/or, the carbide comprises at least one of SiCx, GeCx and AlCx.

5. The selector material according to claim 1, wherein the selector material has nonlinear conductivity characteristics to be used in a neural network as a neural component; and/or, the selector material has ovonic threshold switching type selection characteristics.

6. The selector material according to claim 1, wherein when the selector material is in the high-resistance state, the selector material comprises an amorphous state or a crystalline state; and when the selector material is in the low-resistance state, the selector material comprises an amorphous state, a crystalline state or a molten state.

7. A selector unit, comprises: a selector material layer, a first electrode and a second electrode, wherein the selector material layer comprises the selector material as claimed in claim 1, the first electrode and the second electrode are respectively arranged on the upper surface or the lower surface of the selector material layer, or the first electrode and the second electrode are arranged on the same surface of the selector material layer.

8. The selector unit according to claim 7, wherein a thickness of the selector material layer is between 2 nm and 100 nm; and a shape of the second electrode comprises a T shape, a u shape, and partially or fully-defined shapes.

9. The selector unit according to claim 7, wherein a turn-on current of the selector unit is greater than or equal to $10^{-4}$ A, a leakage current of the selector unit is less than or equal to $10^{-5}$ A, a cycle number of the selector unit is greater than or equal to $10^{3-}$; and an on/off current ratio of the selector unit is between 1-8 orders of magnitude.

10. A preparation method of the selector unit according to claim 7, wherein the preparation method comprises the following steps: providing a substrate, and preparing the first electrode, the second electrode, and the selector material layer on the substrate, wherein the selector material layer is prepared based on a magnetron sputtering process.

11. A memory structure, comprising:

the selector unit as claimed in claim 7;

a storage material layer, arranged on a lower surface of the second electrode; and a third electrode, arranged on a lower surface of the storage material layer.

12. The memory structure according to claim 11, wherein the storage material layer comprises any one of a phase change storage material layer, a resistive storage material layer, a magnetic storage material layer, and a ferroelectric storage material layer.

13. The memory structure according to claim 11, wherein the memory structure comprises a plurality of the first electrodes arranged in parallel at intervals and a plurality of the third electrodes arranged in parallel at intervals, wherein the first electrodes extend along a first direction, and the third electrodes extend along a second direction; wherein an angle is formed between the first direction and the second direction, the angle is greater than 0° and less than or equal to 90°; the selector material layer, the second electrode, and the storage material layer together constitute a selection storage unit, and the memory structure comprises a plurality of the selection storage units, and the selection storage units are arranged in the overlapping area of the first electrodes and the third electrodes.

14. The memory structure according to claim 13, wherein the selector material layer, the second electrode and the storage material layer all comprise at least N layers, which are stacked in a vertical direction to form an N-layered structure, and a storage density of the obtained memory structure is $4\,F^2/N$, to achieve mass storage, wherein F is the feature size of the semiconductor process, and N is an integer greater than or equal to 2.

* * * * *